(12) United States Patent
Xia et al.

(10) Patent No.: US 11,828,778 B2
(45) Date of Patent: Nov. 28, 2023

(54) ALTERNATING CURRENT RESISTANCE DETECTION CIRCUIT AND SYSTEM

(71) Applicant: Shanghai Natlinear Electronics Co., Ltd., Shanghai (CN)

(72) Inventors: Hu Xia, Shanghai (CN); Chunda Wu, Shanghai (CN); Dongfeng Wang, Shanghai (CN); Guizhi Liu, Shanghai (CN)

(73) Assignee: Shanghai Natlinear Electronics Co., Ltd., Shanghai (CN)

( * ) Notice: Subject to any disclaimer, the term of this patent is extended or adjusted under 35 U.S.C. 154(b) by 0 days.

(21) Appl. No.: 18/028,570

(22) PCT Filed: Aug. 18, 2021

(86) PCT No.: PCT/CN2021/113288
§ 371 (c)(1),
(2) Date: Mar. 27, 2023

(87) PCT Pub. No.: WO2022/062776
PCT Pub. Date: Mar. 31, 2022

(65) Prior Publication Data
US 2023/0324442 A1   Oct. 12, 2023

(30) Foreign Application Priority Data
Sep. 28, 2020 (CN) .......................... 202011038160.7

(51) Int. Cl.
*G01R 27/02* (2006.01)

(52) U.S. Cl.
CPC ..................... *G01R 27/02* (2013.01)

(58) Field of Classification Search
CPC ................................ G01R 27/00; G01R 27/02
(Continued)

(56) References Cited

U.S. PATENT DOCUMENTS

| 4,196,475 | A | 4/1980 | Hall | |
| 4,408,282 | A * | 10/1983 | Hof | G01N 27/223 |
| | | | | 702/65 |
| 10,578,662 | B2 * | 3/2020 | Huang | G01R 31/54 |

FOREIGN PATENT DOCUMENTS

| CN | 103399208 A | 11/2013 |
| CN | 205194297 A | 4/2016 |

(Continued)

*Primary Examiner* — Hoai-An D. Nguyen

(57) ABSTRACT

An AC resistance detection circuit and system. The circuit includes: a working state control module, generating a working state control signal; a sampling module, outputting a sampling signal of a resistance between a neutral wire and a live wire in the detection state; a comparison module, receiving a reference signal and the sampling signal, and outputting a comparison result; a counting signal generation module, receiving an oscillation signal and the working state control signal, and outputting the oscillation signal as a counting signal in the detection state; a zero clearing module, receiving the comparison result and the working state control signal, and outputting an active zero clearing signal when resistance between the neutral wire and the live wire is greater than a threshold; and a counting module, connected to the counting signal and the zero clearing signal, and outputting a high level when a count value reaches a preset value.

20 Claims, 5 Drawing Sheets

(58) Field of Classification Search
USPC .................................. 324/600, 649, 691, 705
See application file for complete search history.

(56) References Cited

FOREIGN PATENT DOCUMENTS

| CN | 206684220 U | * | 11/2017 | ............. | G01R 19/25 |
|---|---|---|---|---|---|
| CN | 111707962 A | | 9/2020 | | |
| CN | 111929504 | | 11/2020 | | |
| CN | 212364426 U | * | 1/2021 | ............. | G01R 27/02 |

* cited by examiner

ALTERNATING CURRENT RESISTANCE DETECTION CIRCUIT AND SYSTEM

FIELD OF TECHNOLOGY

The present invention relates to the field of circuit design, and in particular, to an alternating current (AC) resistance detection circuit and system.

BACKGROUND

In many application scenarios, a power supply status of an AC power supply needs to be detected. Such detections are usually made by detecting a resistance between a neutral wire and a live wire of an AC grid. The AC grid is considered to be in a blackout state only when a detection circuit detects that the resistance between the neutral wire and the live wire is less than a threshold.

When using an AC resistance detection circuit, the neutral wire and the live wire need to be distinguished from each other. If two detection circuits are connected in parallel to the AC grid and neutral wires and live wires are cross-connected, a current output from one detection circuit may enter the other detection circuit, causing the detection circuit to output an incorrect detection signal. A current solution is to strictly distinguish between a neutral wire and a live wire during the wiring of a detection circuit, to avoid mixed connection of the neutral wire and the live wire. This usually causes inconvenience to users and increases the probability of errors.

Therefore, it is necessary to avoid detection errors caused by the mixed connection of the neutral wire and the live wire.

SUMMARY

The present invention provides an alternating current (AC) resistance detection circuit and system.

The present invention provides an AC resistance detection circuit. The AC resistance detection circuit includes at least: a working state control module, a sampling module, a comparison module, a counting signal generation module, a zero clearing module, and a counting module.

The working state control module receives an oscillation signal and generates a working state control signal to control a working state to sequentially and alternately switch between a detection state and a waiting state.

The sampling module has a first terminal and a second terminal respectively connected to a neutral wire and a live wire and a control terminal connected to an output terminal of the working state control module, samples a resistance between the neutral wire and the live wire in the detection state, and outputs a sampling signal.

The comparison module receives a reference signal, is connected to an output terminal of the sampling module, compares the sampling signal with the reference signal, and outputs a corresponding comparison result.

The counting signal generation module receives the oscillation signal, is connected to the output terminal of the working state control module, and outputs the oscillation signal as a counting signal in the detection state.

The zero clearing module is connected to the output terminal of the comparison module and the output terminal of the working state control module, and outputs an active zero clearing signal when the resistance between the neutral wire and the live wire in the detection state is greater than a threshold.

The counting module is connected to an output terminal of the counting signal generation module and an output terminal of the zero clearing module, implements counting based on the counting signal and the zero clearing signal, and outputs a high level when a count value reaches a preset value.

The preset value is greater than the number of cycles of the oscillation signal within one cycle of the detection state.

Optionally, the working state control module includes a frequency divider and an inverter; the frequency divider receives the oscillation signal and performs frequency division on the oscillation signal; and the inverter is connected to an output terminal of the frequency divider, negates an output signal of the frequency divider, and outputs the working state control signal.

Optionally, the counting signal generation module includes an AND logic unit, and the AND logic unit has input terminals respectively connected to the oscillation signal and the working state control signal and generates the counting signal after performing an AND operation.

Optionally, the zero clearing module includes an OR logic unit, and the OR logic unit has input terminals respectively connected to an inverted signal of the working state control signal and the comparison result, and generates the zero clearing signal after performing an OR operation.

Optionally, the sampling module includes a transistor, a first resistor, a second resistor, and a third resistor; the transistor and the first resistor are connected in series between a supply voltage and the first terminal of the sampling module, and the second resistor and the third resistor are connected in series between the second terminal of the sampling module and the ground; and a base of the transistor is connected to the working state control module, and a connection node between the second resistor and the third resistor outputs the sampling signal.

Further optionally, the reference signal satisfies the following relational expression:

$$0 < Vref < \frac{Vdd * R3}{R1 + R2 + R3},$$

Vref is the reference signal, Vdd is the supply voltage, R1 is a resistance value of the first resistor, R2 is a resistance value of the second resistor, and R3 is a resistance value of the third resistor.

More optionally, the AC resistance detection circuit further includes a frequency jitter module and an oscillator; and the oscillator is connected to an output terminal of the frequency jitter module and generates the oscillation signal, and a frequency of the oscillation signal jitters within a preset frequency range.

The present invention further provides an AC resistance detection system, which includes at least:
  two AC resistance detection circuits described above, in which a first AC resistance detection circuit has a first terminal connected to the neutral wire and a second terminal connected to the live wire; and a second AC resistance detection circuit has a first terminal connected to the live wire and a second terminal connected to the neutral wire.

The present invention further provides an AC resistance detection system, which includes at least:
  two AC resistance detection circuits described above, in which a first AC resistance detection circuit has a first terminal connected to the neutral wire and a second terminal connected to the live wire; and a second AC resistance detection circuit has a first terminal connected to the neutral wire and a second terminal connected to the live wire.

As described above, the AC resistance detection circuit and system consistent with the present invention have the following beneficial effects:

According to the AC resistance detection circuit and system consistent with the present invention, when access terminals of the neutral wire and the live wire are reversely connected in a mixed manner and there is no other resistance between the AC live wire and the neutral wire, no error occurs in an output signal and system reliability is improved. In addition, there is no need to distinguish between the neutral wire and the live wire, making it easy to use and improving customer experience.

Figure 1:
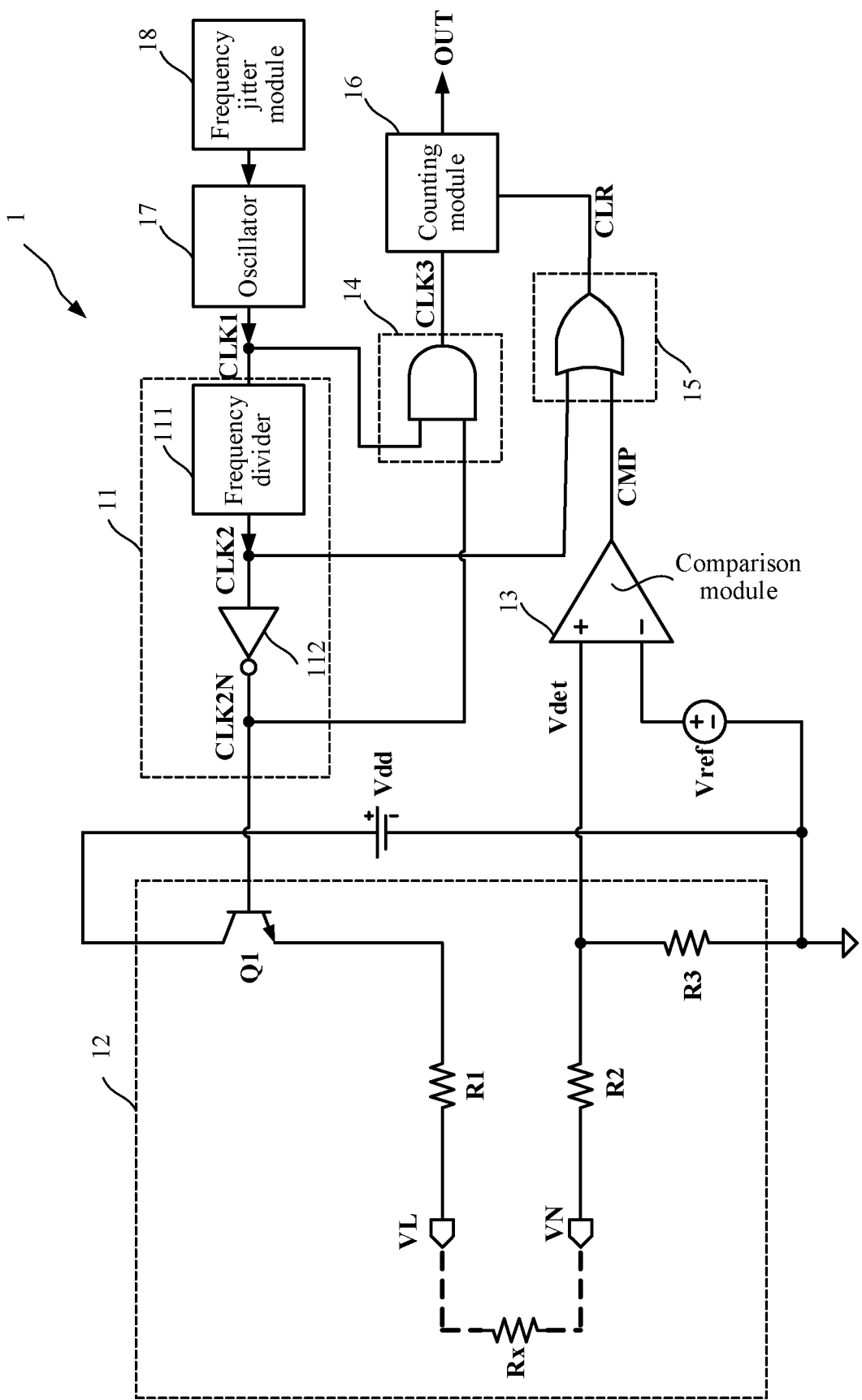
FIG. 1 is a schematic structural diagram of an AC resistance detection circuit of the present invention.

| Description of reference numerals | |
|---|---|
| 1, 1a, 1b | AC resistance detection circuit, first AC resistance detection circuit, second AC resistance detection circuit |
| 11, 11a, 11b | Working state control module |
| 111, 111a, 111b | Frequency divider |
| 112, 112a, 112b | Inverter |
| 12, 12a, 12b | Sampling module |
| 13, 13a, 13b | Comparison module |
| 14, 14a, 14b | Counting signal generation module |
| 15, 15a, 15b | Zero clearing module |
| 16, 16a, 16b | Counting module |
| 17, 17a, 17b | Oscillator |
| 18, 18a, 18b | Frequency jitter module |

DETAILED DESCRIPTION OF THE PREFERRED EMBODIMENTS

Implementations of the present invention are illustrated below by specified specific examples, and other advantages and efficacy of the present invention can be readily understood by a person skilled in the art from the contents disclosed in this specification. The present invention can also be implemented or applied through other different specific implementations, and various modifications or changes can be made to the details in this specification based on different viewpoints and applications without departing from the spirit of the present invention.

Refer to FIG. 1 to FIG. 6. It should be noted that, the drawings provided in the embodiments merely illustrate the basic concepts of the present invention schematically. Therefore, the drawings show only components related to the present invention rather than being drawn according to the quantities, shapes, and sizes of components in actual implementation. Patterns, quantities, and proportions of components in actual implementation may be changed arbitrarily, and the component layout may be more complex.

Embodiment 1

As shown in FIG. 1, this embodiment provides an AC resistance detection circuit 1. The AC resistance detection circuit 1 includes:

a working state control module 11, a sampling module 12, a comparison module 13, a counting signal generation module 14, a zero clearing module 15, and a counting module 16.

As shown in FIG. 1, the working state control module 11 receives an oscillation signal CLK1 and generates a working state control signal CLK2N to control a working state to sequentially and alternately switch between a detection state and a waiting state.

Specifically, in this embodiment, the working state control module 11 includes a frequency divider 111 and an inverter 112. The frequency divider 111 receives the oscillation signal CLK1 and performs frequency division on the oscillation signal CLK1. In an example, the frequency divider is configured to implement divide-by-16 frequency division. The inverter 112 is connected to an output terminal of the frequency divider 111, negates an output signal CLK2 of the frequency divider 111, and outputs the working state control signal CLK2N. In this embodiment, when the working state control signal CLK2N is at a high level, the AC resistance detection circuit 1 is controlled to work in the detection state to detect a resistance Rx between a neutral wire and a live wire. Here Rx includes an equivalent resistance of lines of a power grid and other electrical equipment connected to the power grid. When the working state control signal CLK2N is at a low level, the AC resistance detection circuit 1 is controlled to work in the waiting state, and the resistance Rx between the neutral wire and the live wire is not detected. The working state of the AC resistance detection circuit 1 periodically switches between the detection state and the waiting state. Duration of one detection state is equal to low level duration of the output signal CLK2 of the frequency divider 111, and is recorded as one detection cycle.

As shown in FIG. 1, in an implementation of the present invention, the oscillation signal CLK1 is generated by an oscillator 17, an input terminal of the oscillator 17 is connected to an output terminal of a frequency jitter module 18, and the frequency jitter module 18 adds a low-frequency variable to the oscillation signal generated by the oscillator 17, so that a frequency of a finally outputted oscillation signal CLK1 is not always fixed, but jitters within a preset frequency range. The low-frequency variable may be set based on the preset frequency range, and details are not described herein.

As shown in FIG. 1, the sampling module 12 has a first terminal VL and a second terminal VN respectively connected to a neutral wire and a live wire, and has a control terminal connected with an output terminal of the working state control module 11, samples a resistance between the neutral wire and the live wire in the detection state, and outputs a sampling signal Vdet.

Specifically, in this embodiment, the sampling module 12 includes a transistor Q1, a first resistor R1, a second resistor R2, and a third resistor R3. The transistor Q1 and the first resistor R1 are connected in series between a supply voltage Vdd and the first terminal VL of the sampling module 12, and a base of the transistor Q1 is connected to the output terminal of the working state control module 11. In an example, the transistor Q1 has a collector connected to the supply voltage Vdd, an emitter connected to the first terminal VL of the sampling module 12 through the first resistor, and a base connected to the working state control signal CLK2N outputted by the working state control module 11. The transistor Q1 is turned on when the working state control signal CLK2N is at a high level, and the transistor Q1 is turned off when the working state control signal CLK2N is at a low level. The second resistor R2 and the third resistor R3 are connected in series between the second terminal VN of the sampling module 12 and the ground. A connection node between the second resistor R2 and the third resistor R3 outputs the sampling signal Vdet.

Specifically, in the waiting state, the transistor Q1 is turned off. Therefore, a current flowing through the first resistor R1, the resistance Rx between the neutral wire and the live wire, the second resistor R2, and the third resistor R3 is 0. In this case, the sampling signal Vdet is 0. In the detection state, the transistor Q1 is turned on, and it may be approximately considered that the collector and the emitter of the transistor Q1 are at an equal voltage. In this case, a current outputted by the supply voltage Vdd flows through the transistor Q1 and the resistors R1, Rx, R2, and R3 sequentially, and the sampling signal Vdet satisfies the following expression:

$$V\text{det} = \frac{Vdd*R3}{R1+Rx+R2+R3},$$

when the resistor Rx between the live wire and the neutral wire is infinitely great:

Vdet=0, and when the resistor Rx between live wire and the neutral wire is close to infinitely small:

$$V\text{det} = \frac{Vdd*R3}{R1+R2+R3}$$

As shown in FIG. 1, the comparison module 13 receives a reference signal Vref, is connected to an output terminal of the sampling module 12, compares the sampling signal Vdet with the reference signal Vref, and outputs a corresponding comparison result CMP.

Specifically, in this embodiment, the comparison module 13 has a non-inverting input terminal connected to the sampling signal Vdet and an inverting input terminal connected to the reference signal Vref. In actual use, a connection relationship between an input signal and input terminals with different polarities may be adjusted by adding an inverter, which is not limited to this embodiment, provided that a same logic relationship can be achieved. In this embodiment, in the detection state, if Rx<Rth, (in an example, the threshold Rth satisfies the following expression:

$$Rth = \frac{Vdd*R3}{Vref} - (R1+R2+R3)),$$

then Vdet>Vref, and the comparison result CMP is a high level; if Rx>Rth, then Vdet<Vref, and the comparison result CMP is a low level.

Specifically, the reference signal satisfies the following relational expression:

$$0 < Vref < \frac{Vdd*R3}{R1+R2+R3}.$$

As shown in FIG. 1, the counting signal generation module 14 receives the oscillation signal CLK1, is connected to the output terminal of the working state control module 11, and outputs the oscillation signal as a counting signal CLK3 in the detection state.

Specifically, the counting signal generation module 14 includes an AND logic unit, and the AND logic unit has input terminals respectively connected to the oscillation signal CLK1 and the working state control signal CLK2N and generates the counting signal CLK3 after performing an AND operation. In an example, the AND logic unit is implemented by a two-input AND gate. In actual use, any circuit structure or software code that can implement an AND operation is applicable to the present invention. When the working state control signal CLK2N is at the high level (in the detection state), the oscillation signal is outputted as the counting signal CLK3; and when the working state control signal CLK2N is at the low level (in the waiting state), the counting signal CLK3 is at the low level.

As shown in FIG. 1, the zero clearing module 15 is connected to the output terminal of the comparison module 13 and an output terminal of the working state control module 11, and outputs an active zero clearing signal CLR when the resistance between the neutral wire and the live wire in the detection state is greater than a threshold Rth.

Specifically, the zero clearing module 15 includes an OR logic unit, and the OR logic unit has input terminals respectively connected to an inverted signal CLK2 of the working state control signal CLK2N and the comparison result CMP, and generates the zero clearing signal CLR after performing an OR operation. In an example, the OR logic unit is implemented by a two-input OR gate. In actual use, any circuit structure or software code that can implement an OR operation is applicable to the present invention. When the inverted signal CLK2 of the working state control signal CLK2N is at the low level (in the detection state), the zero clearing signal CLR is consistent with the comparison result CMP. When the inverted signal CLK2 of the working state control signal CLK2N is at the high level (in the waiting state), the zero clearing signal CLR is at the high level. In this embodiment, the zero clearing signal CLR is active at the low level (implementing a zero-clearing function).

As shown in FIG. 1, the counting module 16 is connected to an output terminal of the counting signal generation module 14 and an output terminal of the zero clearing module 15, implements counting based on the counting signal CLK3 and the zero clearing signal CLR, and outputs a high level when a count value reaches a preset value, wherein the preset value is greater than the number of cycles of the oscillation signal within one cycle of the detection state.

Specifically, the counting module 16 has an input terminal connected to the counting signal CLK3 and a zero clearing terminal connected to the zero clearing signal CLR. In the detection state, when the zero clearing signal CLR is at the high level, the counting module 16 counts the number of square waves of the counting signal CLK3. When a count value reaches a preset value, an output signal of the counting module 16 jumps from the low level to the high level. When the zero clearing signal CLR is active (which is active at the low level in this embodiment), the counting module 16 is cleared to zero.

Figure 2:
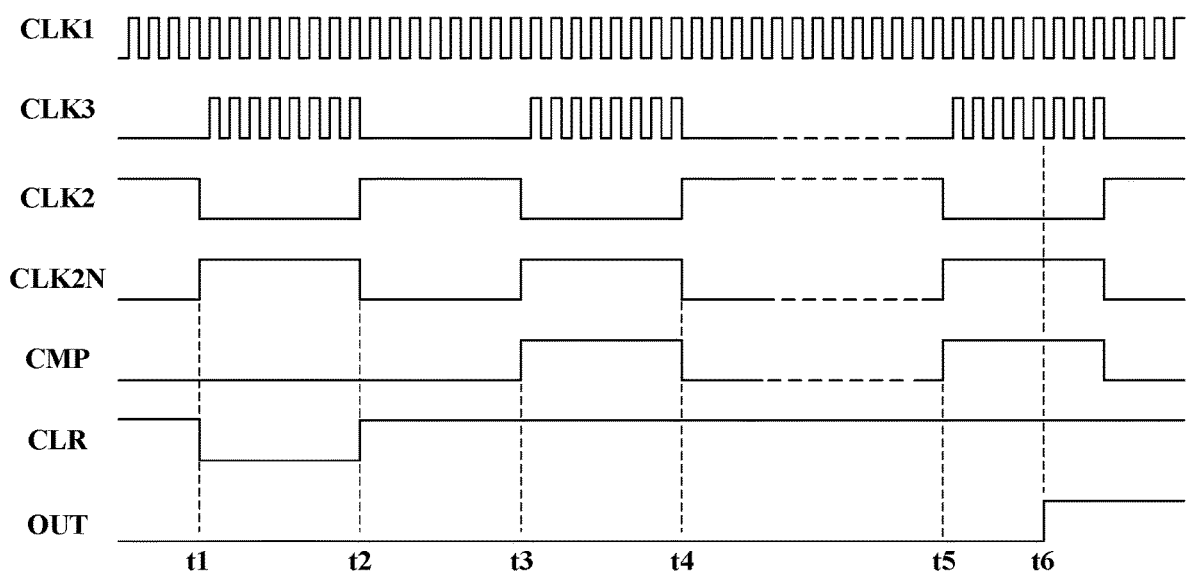
FIG. 2 is a schematic working principle diagram of an AC resistance detection circuit of the present invention.

As shown in FIG. 2, in the detection state, the working state control signal CLK2N is at the high level, the inverted signal CLK2 of the working state control signal CLK2N is at the low level, and the counting signal CLK3 is a square wave signal. In this case, the counting signal CLK3 and the oscillation signal CLK1 have the same phase and frequency. If the comparison result CMP is at the low level, the zero clearing signal CLR is at the low level, the counting module 16 is cleared, and the count value OUT changes to 0, as shown in a time period of t1 to t2. If the comparison result CMP is at the high level, the zero clearing signal CLR is at the high level, and the counting module 16 is not cleared. In this case, the counting module 16 counts the number of square waves of the counting signal CLK3, as shown in a time period of t3 to t4.

As shown in FIG. 2, in the waiting state, the inverted signal CLK2 of the working state control signal CLK2N is at the high level, the zero clearing signal CLR is at the high level, and the counting module 16 is not cleared. The working state control signal CLK2N is at the low level, the counting signal CLK3 is at the low level, and a clock signal of the counting module 16 is at the low level. Therefore, the count value OUT of the counting module 16 remains unchanged, as shown in a time period of t2 to t3.

As shown in FIG. 2, the counting module 16 performs counting, and after the count value reaches the preset value, an output of the counting module 16 changes from the low level to the high level.

As shown in FIG. 2, within a detection cycle, an increment of the count value of the counting module 16 is determined by the number of square waves of the counting signal CLK3 within one detection cycle. In this embodiment, the counting signal CLK3 includes eight square waves within one detection cycle. Within a single detection cycle, the increment of the count value of the counting module 16 is less than the preset value. Therefore, the count value of the counting module 16 can be increased to the preset value only after at least two counting cycles and in the case that the counting module 16 is not cleared. Then, the output signal of the counting module 16 changes from the low level to the high level, as shown at moment t6. If the output signal CMP of the comparison module 13 is at the low level within any detection cycle, the zero clearing signal CLR changes to the low level, and the counting module 16 is cleared.

In summary, when the AC resistance detection circuit 1 works in the waiting state, the transistor Q1 is turned off, and the count value of the counting module 16 remains unchanged.

When the AC resistance detection circuit 1 works in the detection state, the transistor Q1 is turned on, and the counting module 16 performs counting if it is detected that the resistor Rx between the live wire and the neutral wire is less than Rth, which causes the comparison result CMP to be at the high level.

When the AC resistance detection circuit 1 works in the detection state, the transistor Q1 is turned on, and the counting module 16 is cleared by the zero clearing signal CLR if it is detected that the resistor Rx between the live wire and the neutral wire is greater than Rth, which causes the comparison result CMP to be at the low level.

The AC resistance detection circuit 1 periodically switches between the detection state and the waiting state. If within a plurality of consecutive detection cycles, the resistor Rx between the live wire and the neutral wire is less than Rth, after the count value of the counting module 16 increases to the preset value, the output signal of the counting module 16 changes from the low level to the high level.

Comparative Example

Figure 3:
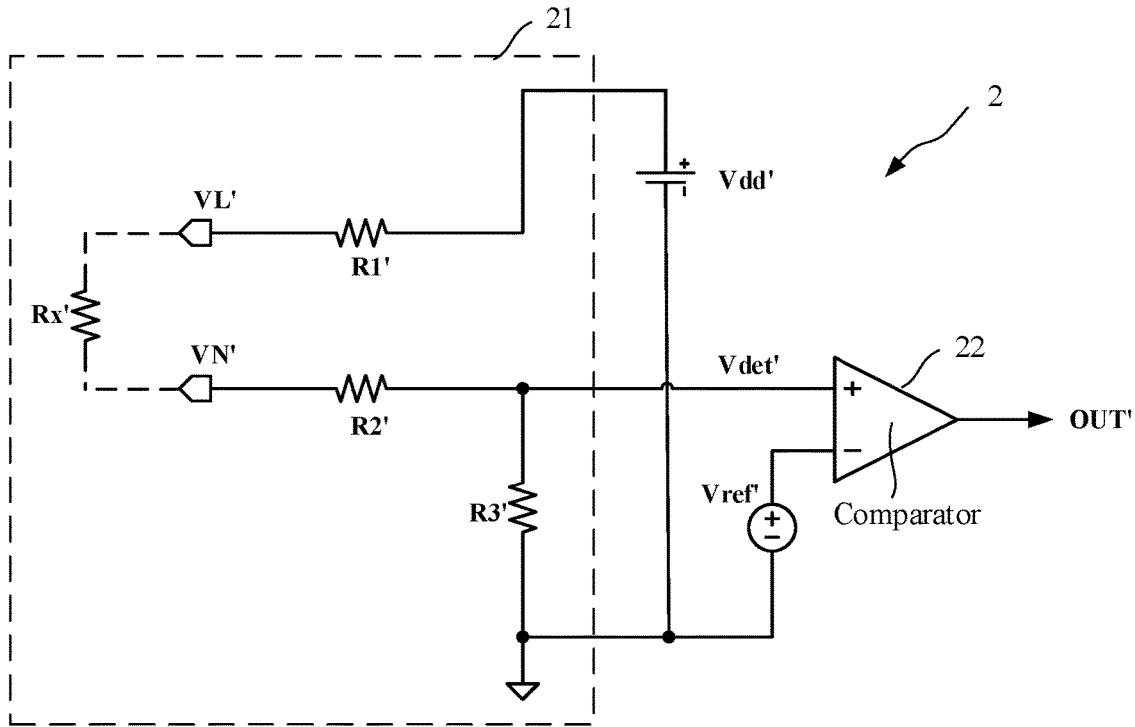
FIG. 3 is a schematic structural diagram of an AC resistance detection circuit.

FIG. 3 shows an AC resistance detection circuit 2, including a sampling module 21 and a comparator 22. The sampling module 21 includes resistors R1', R2', and R3'. The resistor R1' has one terminal connected to the supply voltage Vdd and the other terminal connected to the live wire. The resistor R2' has one terminal connected to the neutral wire and the other terminal grounded through the resistor R3'. In addition, a connection node of the resistors R2' and R3' outputs a sampling signal Vdet'. The comparator 22 has an input terminal connected to the sampling signal Vdet' and a reference signal Vref', and outputs a comparison result OUT'.

The working principle of the AC resistance detection circuit 2 is as follows:

The AC resistance detection circuit 2 has a first terminal VL and a second terminal VN connected to an AC live wire and a neutral wire, and is configured to detect a resistance Rx' (Rx' is a resistance between the AC live wire and the neutral wire, and the resistance includes an equivalent resistance of lines of a power grid and other electrical equipment connected to the power grid) between the neutral wire and the live wire in case of an AC power blackout. When there is a blackout, there is no AC voltage signal between the first terminal VL and the second terminal VN of the AC resistance detection circuit 2, a current outputted by the supply voltage Vdd flows through the resistors R1', Rx', R2', and R3' sequentially, to obtain the sampling signal Vdet', which satisfies the following expression:

$$V\text{det}' = \frac{Vd' * R3'}{R1' + Rx' + R2' + R3'}$$

When the resistance Rx' between the live wire and the neutral wire is less than a particular value, which makes Vdet'>Vref', the output signal OUT' of the comparator is at a high level. When the resistance Rx' between the live wire and the neutral wire is greater than a particular value, which makes Vdet'<Vref', the output signal OUT' of the comparator is at a low level.

Figure 4:
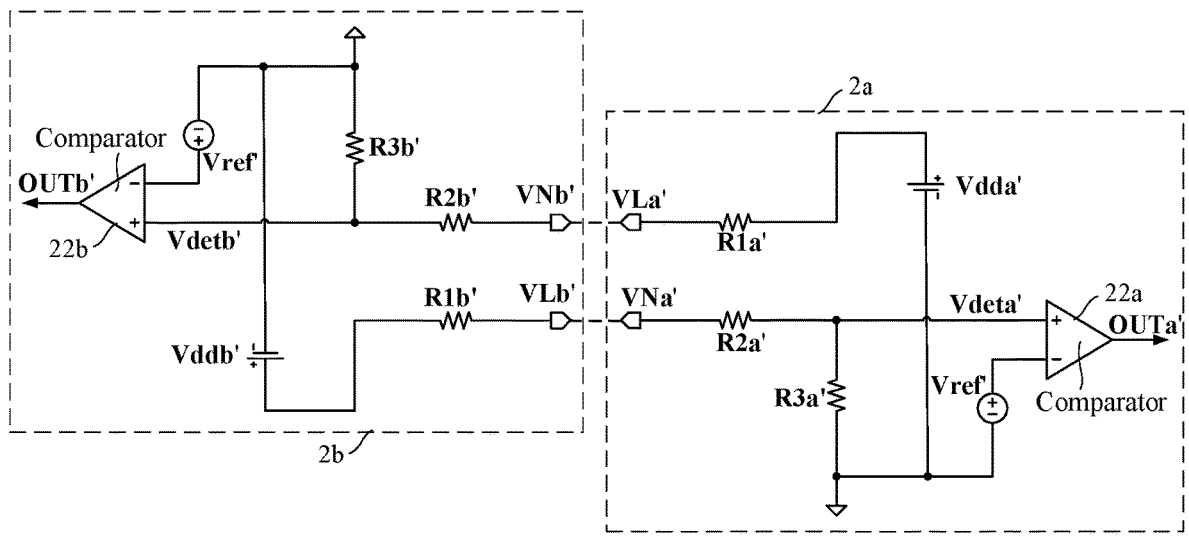
FIG. 4 is a schematic structural diagram of two AC resistance detection circuits in FIG. 3 with neutral wires and live wires reversely connected in a mixed manner.

As shown in FIG. 4, when neutral wires and live wires of two AC resistance detection circuits 2 are reversely connected in a mixed manner, and there is no other resistance between the AC live wire and the neutral wire, a current outputted by one AC resistance detection circuit would enter the other AC resistance detection circuit. Consequently, an error may occur in the output signal of the AC resistance detection circuit. The principle is analyzed as follows:

Neutral wires and live wires of an AC resistance detection circuit 2a and an AC resistance detection circuit 2b are reversely connected in a mixed manner, connected in parallel to the AC live wire and the neutral wire, and there is no other resistance between the AC live wire and the neutral wire. In this case, the resistance Rx on the AC neutral wire and the live wire is infinitely great. Therefore, an output signal OUTa' of a comparator 22a in the AC resistance detection circuit 2a should be at a low level, but the output signal OUTa' obtained through calculation and analysis below is at a high level.

When the neutral wires and live wires of the two AC resistance detection circuits are reversely connected in a mixed manner, the two detection circuits are connected in series, a current outputted by the AC resistance detection circuit 2a enters the AC resistance detection circuit 2b, and a current outputted from a positive electrode of a power supply Vdda' flows through resistors R1a', R2b', and R3b', a power supply Vddb', and resistors R1b', R2a', and R3a', and then flows back to a negative electrode of the power supply Vdda'. A voltage at a first input terminal of the comparator 22a in the AC resistance detection circuit 2a is:

$$V\text{deta}' = \frac{(Vdda' + Vddb') * R3a'}{(R1a' + R2a' + R3a') + (R1b' + R2b' + R3b')}$$

It is assumed that Vdda'=Vddb'=Vdd', R1a'=R1b'=R1', R2a'=R2b'=R2', and R3a'=R3b'=R3'. Simplified:

$$V\text{deta}' = \frac{Vdd * R3}{R1 + R2 + R3} > Vref$$

As illustrated by the foregoing calculation result, the voltage at the first input terminal of the comparator 22a is higher than a voltage at a second input terminal of the comparator 22a. The output signal OUTa' of the comparator 22a is at the high level. An output signal of a detection circuit in this case is different from an output signal of the detection circuit independently connected to an AC neutral wire and live wire. In this case, the detection circuit outputs an incorrect signal.

Embodiment 2

Figure 5:
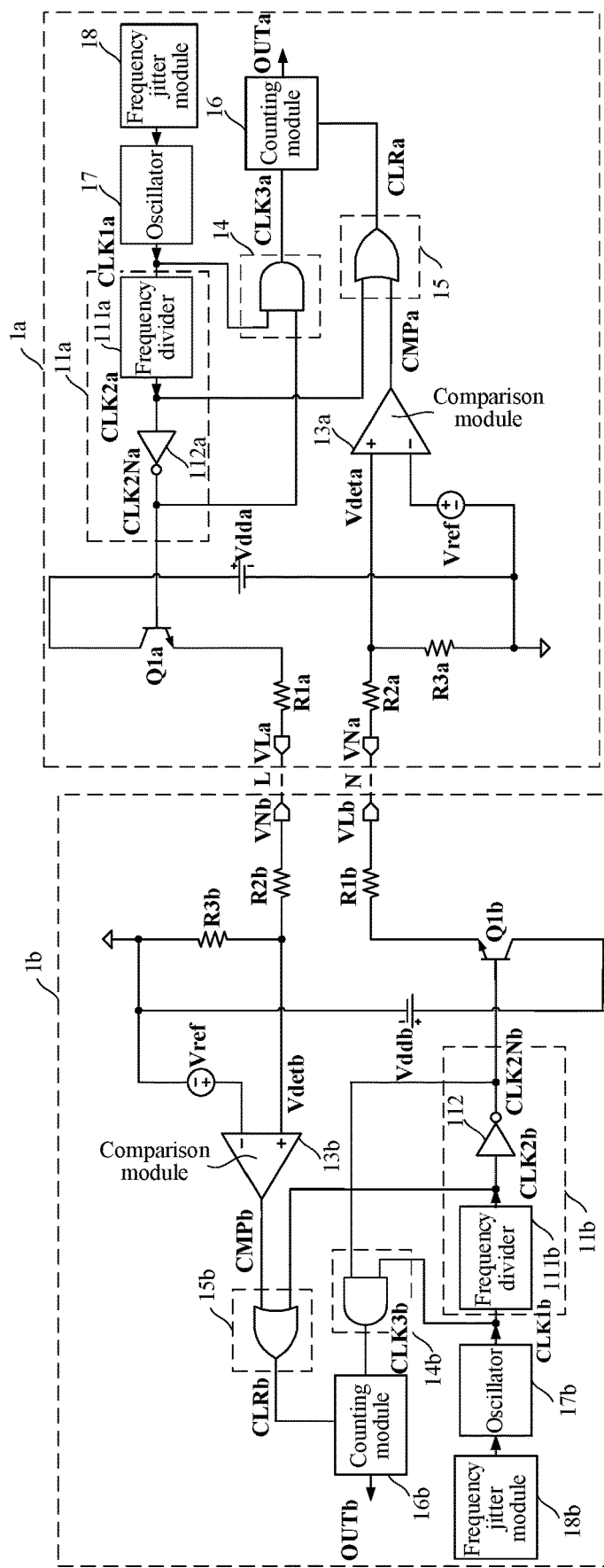
FIG. 5 is a schematic structural diagram of two AC resistance detection circuits of the present invention with neutral wires and live wires reversely connected in a mixed manner.

As shown in FIG. 5, this embodiment provides an AC resistance detection system. The AC resistance detection system includes:

a first AC resistance detection circuit and a second AC resistance detection circuit, in which the first AC resistance detection circuit 1a has a first terminal VLa connected to a neutral wire N and a second terminal VNa connected to a live wire L; the second AC resistance detection circuit 1b has a first terminal VLb connected to the live wire L and a second terminal VNb connected to the neutral wire N. The first AC resistance detection circuit 1a and the second AC resistance detection circuit 1b adopt the AC resistance detection circuit structure of Embodiment 1.

As shown in FIG. 5, when neutral wires and live wires of the first AC resistance detection circuit 1a and the second AC resistance detection circuit 1b are reversely connected in a mixed manner, and there is no other resistance between the AC live wire and neutral wire, a current outputted by one AC resistance detection circuit may enter the other AC resistance detection circuit. However, no error occurs in each output signal of the AC resistance detection system consistent with the present invention, and the AC resistance detection circuit periodically switches between a detection state and a waiting state. Because the two AC resistance detection circuits have the same working principle, only the first AC resistance detection circuit 1a is analyzed and described below. There may be the following three cases:

Case 1: The first AC resistance detection circuit 1a works in the waiting state. A transistor Q1a in the first AC resistance detection circuit 1a is turned off. Regardless of a state in which the second AC resistance detection circuit 1b works, the first AC resistance detection circuit 1a outputs no current, and a current outputted by the second AC resistance detection circuit 1b does not enter the first AC resistance detection circuit 1a. In this case, a working state of the first AC resistance detection circuit 1a is the same as a working state of an AC resistance detection circuit connected to the AC neutral wire and live wire alone. Details are not described herein. A comparison result CMPa outputted by a comparison module 13a in the first AC resistance detection circuit 1a is at a low level, a counting module 16a is not cleared, and a counting result of the counting module 16a remains unchanged, as shown by time periods t0 to t1 and t3 to t4 in FIG. 6.

Case 2: Both the first AC resistance detection circuit 1a and the second AC resistance detection circuit 1b work in the detection state. Both a transistor Q1a in the first AC resistance detection circuit 1a and a transistor Q1b in the second AC resistance detection circuit 1b are turned on, and the two AC resistance detection circuits are connected in series. A current outputted by the first AC resistance detection circuit 1a enters the second AC resistance detection circuit 1b, and a current outputted by the second AC resistance detection circuit 1b enters the first AC resistance detection circuit 1a. A sampling signal Vdeta in the first AC resistance detection circuit 1a satisfies the following expression:

$$V\text{deta} = \frac{(Vdda + Vddb) * R3a}{(R1a + R2a + R3a) + (R1b + R2b + R3b)}$$

To simplify the analysis, it is assumed that power supplies and resistance values in the two AC resistance detection circuits are exactly equal, that is, Vdda=Vddb=Vdd, R1a=R1b=R1, R2a=R2b=R2, R3a=R3b=R3. Simplified:

$$V\text{deta} = \frac{Vdd * R3}{R1 + R2 + R3} > Vref$$

Figure 6:
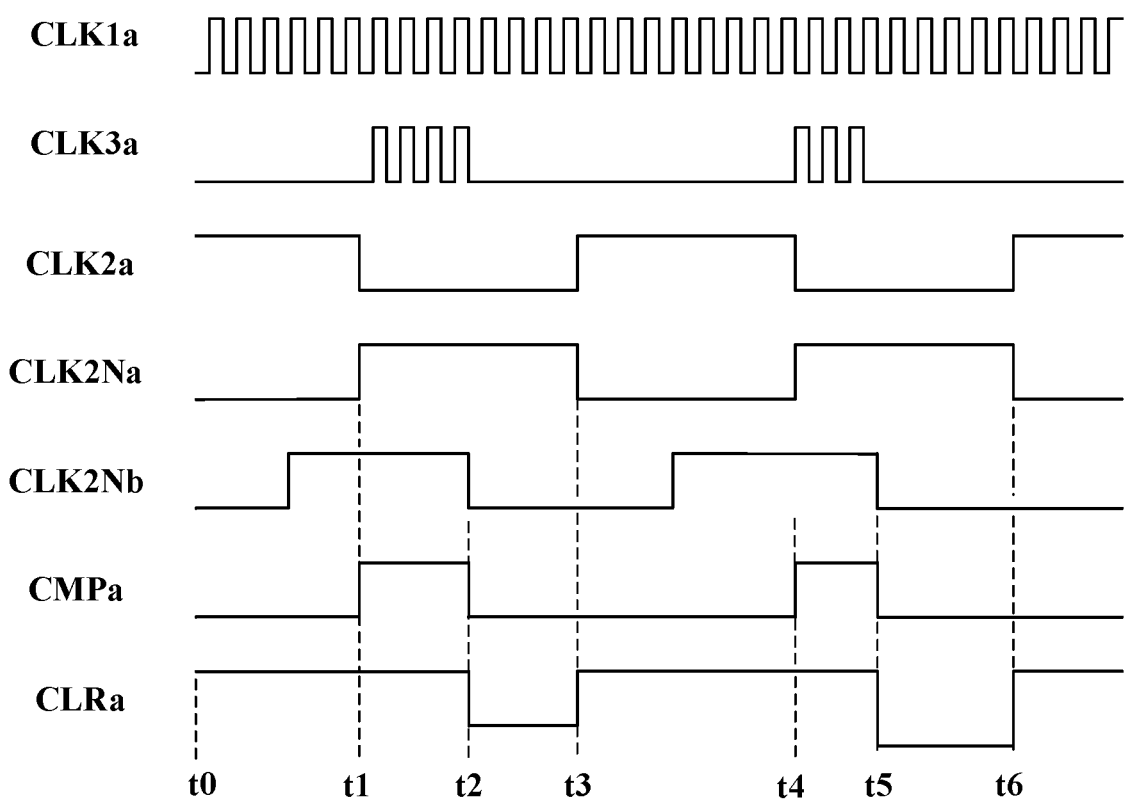
FIG. 6 is a schematic working principle diagram of two AC resistance detection circuits of the present invention with neutral wires and live wires reversely connected in a mixed manner.

In this case, a comparison result CMPa in the first AC resistance detection circuit 1a is at a high level, a zero clearing signal CLRa of a counting module 16a is at the high level, and the counting module 16a performs counting, as shown by time periods t1 to t2 and t4 to t5 in FIG. 6.

Case 3: The first AC resistance detection circuit 1a works in the detection state, and the second AC resistance detection circuit 1b works in the waiting state. A transistor Q1a in the first AC resistance detection circuit 1a is turned on, a transistor Q1b in the second AC resistance detection circuit 1b is turned off, a current outputted by the first AC resistance detection circuit 1a does not enter the second AC resistance detection circuit 1b, and the second AC resistance detection circuit 1b has no output current entering the first AC resistance detection circuit 1a. In this case, a working state of the first AC resistance detection circuit 1a is the same as a working state of an AC resistance detection circuit connected to the AC neutral wire and live wire alone. Because there is no other resistance between the AC neutral wire and live wire, a current flowing through resistors R1a, R2a, and R3a in the first AC resistance detection circuit 1a is 0, a sampling signal Vdeta is 0 V, and a comparison result CMPa is at a low level. An inverted signal CLK2a of the working state control signal CLK2Na is also at the low level, a zero clearing signal CLRa is at the low level, and a counting module 16a is cleared, as shown by time periods t2 to t3 and t5 to t6 in FIG. 6.

Two oscillators in the first AC resistance detection circuit 1a and the second AC resistance detection circuit 1b are independent of each other, and a frequency jitter module causes a frequency of the oscillator to jitter within a particular range. Therefore, it is impossible for the two AC resistance detection circuits to have exactly the same frequency and phase within many consecutive detection cycles; otherwise, the foregoing case 3 easily occurs. The counting module is cleared if the foregoing case 3 occurs before the counting module reaches the preset value.

The preset value is sufficiently large (greater than the number of cycles of the oscillation signal within one cycle of the detection state), and for the first AC resistance detection circuit 1a, before the count value of the counting module 16a increased to the preset value, the counting module 16a is repeatedly cleared, and an output signal OUTa of the counting module 16a does not change from the low level to a high level.

Embodiment 3

This embodiment provides an AC resistance detection system. The AC resistance detection system includes:

a first AC resistance detection circuit and a second AC resistance detection circuit, in which the first AC resistance detection circuit has a first terminal connected to the neutral wire and a second terminal connected to the live wire; the second AC resistance detection circuit has a first terminal connected to the neutral wire and a second terminal connected to the live wire.

Specifically, the AC resistance detection circuit structure of Embodiment 1 is used for the first AC resistance detection circuit and the second AC resistance detection circuit. In this case, because the live wires and neutral wires of the two AC resistance detection circuits are not connected in a mixed manner, a current in the first AC resistance detection circuit does not flow into the second AC resistance detection circuit, a current in the second AC resistance detection circuit does not flow into the first AC resistance detection circuit, and no error occurs in output results.

In summary, the present invention provides an AC resistance detection circuit and system. The circuit includes: a working state control module, a sampling module, a comparison module, a counting signal generation module, a zero clearing module, and a counting module. The working state control module receives an oscillation signal and generates a working state control signal to control a working state to sequentially and alternately switch between a detection state and a waiting state. The sampling module has a first terminal and a second terminal respectively connected to a neutral wire and a live wire, and a control terminal connected to an output terminal of the working state control module, samples a resistance between the neutral wire and the live wire in the detection state, and outputs a sampling signal. The comparison module receives a reference signal, is connected to an output terminal of the sampling module, compares the sampling signal with the reference signal, and outputs a corresponding comparison result. The counting signal generation module receives the oscillation signal, is connected to the output terminal of the working state control module, and outputs the oscillation signal as a counting signal in the detection state. The zero clearing module is connected to the output terminal of the comparison module and the output terminal of the working state control module, and outputs an active zero clearing signal when the resistance between the neutral wire and the live wire in the detection state is greater than a threshold. The counting module is connected to an output terminal of the counting signal generation module and an output terminal of the zero clearing module, implements counting based on the counting signal and the zero clearing signal, and outputs a high level when a count value reaches a preset value. The preset value is greater than the number of cycles of the oscillation signal within one cycle of the detection state. According to the AC resistance detection circuit and system consistent with the present invention, when access terminals of the neutral wire and the live wire are reversely connected in a mixed manner and there is no other resistance between the AC live wire and the neutral wire, no error occurs in an output signal, and thus system reliability is improved. In addition, there is no need to distinguish between the neutral wire and the live wire, making it easy to use and improving customer experience. Therefore, the present invention effectively overcomes various disadvantages in the prior art and therefore has high industrial application value.

The foregoing embodiments illustrate merely the principle and efficacy of the present invention, and are not intended to limit the present invention. A person skilled in the art can make modifications or changes to the foregoing embodiments without departing from the spirit and scope of the present invention. Therefore, all equivalent modifications or changes made by a person of ordinary skill in the art without departing from the spirit and technical ideas disclosed in the present invention shall still fall within the claims of the present invention.

What is claimed is:

1. An alternating current (AC) resistance detection circuit, wherein the AC resistance detection circuit comprises at least: a working state control module, a sampling module, a comparison module, a counting signal generation module, a zero clearing module, and a counting module; wherein
the working state control module receives an oscillation signal and generates a working state control signal to control a working state to sequentially and alternately switch between a detection state and a waiting state;
the sampling module has a first terminal and a second terminal respectively connected to a neutral wire and a live wire and a control terminal connected to an output terminal of the working state control module, samples a resistance between the neutral wire and the live wire in the detection state, and outputs a sampling signal;
the comparison module receives a reference signal, is connected to an output terminal of the sampling module, compares the sampling signal with the reference signal, and outputs a corresponding comparison result;
the counting signal generation module receives the oscillation signal, is connected to an output terminal of the working state control module, and outputs the oscillation signal as a counting signal in the detection state;
the zero clearing module is connected to an output terminal of the comparison module and an output terminal of the working state control module, and outputs an active zero clearing signal when the resistance between the neutral wire and the live wire in the detection state is greater than a threshold; and the counting module is connected to an output terminal of the counting signal generation module and an output terminal of the zero clearing module, implements counting based on the counting signal and the zero clearing signal, and outputs a high level when a count value reaches a preset value, wherein the preset value is greater than the number of cycles of the oscillation signal within one cycle of the detection state.

2. The AC resistance detection circuit according to claim 1, wherein the working state control module comprises a frequency divider and an inverter; the frequency divider is used to receive the oscillation signal and performs frequency division on the oscillation signal; and the inverter is connected to an output terminal of the frequency divider, negates an output signal of the frequency divider, and outputs the working state control signal.

3. The AC resistance detection circuit according to claim 1, wherein the counting signal generation module comprises an AND logic unit, wherein the AND logic unit has input terminals respectively connected to the oscillation signal and the working state control signal and generates the counting signal after performing an AND operation.

4. The AC resistance detection circuit according to claim 1, wherein the zero clearing module comprises an OR logic unit, wherein the OR logic unit has input terminals respectively connected to an inverted signal of the working state control signal and the comparison result, and generates the zero clearing signal after performing an OR operation.

5. The AC resistance detection circuit according to claim 1, wherein the sampling module comprises a transistor, a first resistor, a second resistor, and a third resistor; the transistor and the first resistor are connected in series between a supply voltage and the first terminal of the sampling module, and the second resistor and the third resistor are connected in series between the second terminal of the sampling module and the ground; and a base of the transistor is connected to the working state control module, and a connection node between the second resistor and the third resistor outputs the sampling signal.

6. The AC resistance detection circuit according to claim 5, wherein the reference signal satisfies the following relational expression:

$$0 < Vref < \frac{Vdd * R3}{R1 + R2 + R3},$$

wherein Vref is the reference signal, Vdd is the supply voltage, R1 is a resistance value of the first resistor, R2 is a resistance value of the second resistor, and R3 is a resistance value of the third resistor.

7. The AC resistance detection circuit according to claim 1, wherein the AC resistance detection circuit further comprises a frequency jitter module and an oscillator; and the oscillator is connected to an output terminal of the frequency jitter module and generates the oscillation signal, and a frequency of the oscillation signal jitters within a preset frequency range.

8. An alternating current (AC) resistance detection system, wherein the AC resistance detection system comprises at least:

two AC resistance detection circuits according to claim 1, wherein a first AC resistance detection circuit has a first terminal connected to the neutral wire and a second terminal connected to the live wire; and a second AC resistance detection circuit has a first terminal connected to the live wire and a second terminal connected to the neutral wire.

9. An alternating current (AC) resistance detection system, wherein the AC resistance detection system comprises at least:

two AC resistance detection circuits according to claim 1, wherein a first AC resistance detection circuit has a first terminal connected to the neutral wire and a second terminal connected to the live wire; and a second AC resistance detection circuit has a first terminal connected to the neutral wire and a second terminal connected to the live wire.

10. The AC resistance detection circuit according to claim 2, wherein the AC resistance detection circuit further comprises a frequency jitter module and an oscillator; and the oscillator is connected to an output terminal of the frequency jitter module and generates the oscillation signal, and a frequency of the oscillation signal jitters within a preset frequency range.

11. The AC resistance detection circuit according to claim 3, wherein the AC resistance detection circuit further comprises a frequency jitter module and an oscillator; and the oscillator is connected to an output terminal of the frequency jitter module and generates the oscillation signal, and a frequency of the oscillation signal jitters within a preset frequency range.

12. The AC resistance detection circuit according to claim 4, wherein the AC resistance detection circuit further comprises a frequency jitter module and an oscillator; and the oscillator is connected to an output terminal of the frequency jitter module and generates the oscillation signal, and a frequency of the oscillation signal jitters within a preset frequency range.

13. The AC resistance detection circuit according to claim 5, wherein the AC resistance detection circuit further comprises a frequency jitter module and an oscillator; and the oscillator is connected to an output terminal of the frequency jitter module and generates the oscillation signal, and a frequency of the oscillation signal jitters within a preset frequency range.

14. The AC resistance detection circuit according to claim 6, wherein the AC resistance detection circuit further comprises a frequency jitter module and an oscillator; and the oscillator is connected to an output terminal of the frequency jitter module and generates the oscillation signal, and a frequency of the oscillation signal jitters within a preset frequency range.

15. An alternating current (AC) resistance detection system, wherein the AC resistance detection system comprises at least:

two AC resistance detection circuits according to claim 2, wherein a first AC resistance detection circuit has a first terminal connected to the neutral wire and a second terminal connected to the live wire; and a second AC resistance detection circuit has a first terminal connected to the live wire and a second terminal connected to the neutral wire.

16. An alternating current (AC) resistance detection system, wherein the AC resistance detection system comprises at least:

two AC resistance detection circuits according to claim 3, wherein a first AC resistance detection circuit has a first terminal connected to the neutral wire and a second terminal connected to the live wire; and a second AC resistance detection circuit has a first terminal connected to the live wire and a second terminal connected to the neutral wire.

17. An alternating current (AC) resistance detection system, wherein the AC resistance detection system comprises at least:
two AC resistance detection circuits according to claim 4, wherein a first AC resistance detection circuit has a first terminal connected to the neutral wire and a second terminal connected to the live wire; and a second AC resistance detection circuit has a first terminal connected to the live wire and a second terminal connected to the neutral wire.

18. An alternating current (AC) resistance detection system, wherein the AC resistance detection system comprises at least:
two AC resistance detection circuits according to claim 5, wherein a first AC resistance detection circuit has a first terminal connected to the neutral wire and a second terminal connected to the live wire; and a second AC resistance detection circuit has a first terminal connected to the live wire and a second terminal connected to the neutral wire.

19. An alternating current (AC) resistance detection system, wherein the AC resistance detection system comprises at least:
two AC resistance detection circuits according to claim 6, wherein a first AC resistance detection circuit has a first terminal connected to the neutral wire and a second terminal connected to the live wire; and a second AC resistance detection circuit has a first terminal connected to the live wire and a second terminal connected to the neutral wire.

20. An alternating current (AC) resistance detection system, wherein the AC resistance detection system comprises at least:
two AC resistance detection circuits according to claim 7, wherein a first AC resistance detection circuit has a first terminal connected to the neutral wire and a second terminal connected to the live wire; and a second AC resistance detection circuit has a first terminal connected to the live wire and a second terminal connected to the neutral wire.

* * * * *